(12) United States Patent
Park

(10) Patent No.: US 9,831,368 B2
(45) Date of Patent: Nov. 28, 2017

(54) SOLAR CELL APPARATUS AND METHOD FOR FABRICATING THE SAME

(75) Inventor: Gi Gon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 36 days.

(21) Appl. No.: 14/352,377

(22) PCT Filed: Jun. 21, 2012

(86) PCT No.: PCT/KR2012/004923
§ 371 (c)(1),
(2), (4) Date: Jul. 15, 2014

(87) PCT Pub. No.: WO2013/058463
PCT Pub. Date: Apr. 25, 2013

(65) Prior Publication Data
US 2014/0326312 A1    Nov. 6, 2014

(30) Foreign Application Priority Data

Oct. 17, 2011   (KR) ................ 10-2011-0106120

(51) Int. Cl.
*H01L 31/046* (2014.01)
*H01L 31/048* (2014.01)
*H01L 31/0248* (2006.01)
*H01L 31/0216* (2014.01)
*H01L 31/0749* (2012.01)
*H01L 31/0465* (2014.01)

(52) U.S. Cl.
CPC ........ *H01L 31/0481* (2013.01); *H01L 31/046* (2014.12); *H01L 31/0465* (2014.12); *H01L 31/0749* (2013.01); *Y02E 10/541* (2013.01)

(58) Field of Classification Search
CPC ...... H01L 31/048; H01L 31/09; H01L 31/125
USPC ......................... 136/251, 252, 259
See application file for complete search history.

(56) References Cited

U.S. PATENT DOCUMENTS

| 2006/0207646 | A1  | 9/2006  | Terreau et al. |
| 2009/0205704 | A1* | 8/2009  | Flaherty ............... H02S 20/24 |
|              |     |         | 136/251 |
| 2011/0303263 | A1* | 12/2011 | Corfias-Zuccalli ..... C08L 23/06 |
|              |     |         | 136/251 |
| 2012/0012161 | A1  | 1/2012  | Lee |

(Continued)

FOREIGN PATENT DOCUMENTS

| CN | 101654607 A | * | 2/2010 |
| JP | 2001-036118 A |   | 2/2001 |

(Continued)

OTHER PUBLICATIONS

CN101654607A, Qixiang et al. Feb. 24, 2010, English machine translation of the specification.*

(Continued)

*Primary Examiner* — Susan D Leong
(74) *Attorney, Agent, or Firm* — Saliwanchik, Lloyd & Eisenschenk

(57) ABSTRACT

Disclosed are a solar cell apparatus and a method for fabricating the same. The solace cell apparatus according to the embodiment includes a solar cell formed on a support substrate; a polymer adhesive layer including photo-curable polymer on the solar cell; and a protective panel on the polymer adhesive layer.

7 Claims, 2 Drawing Sheets

(56) References Cited

U.S. PATENT DOCUMENTS

| 2012/0199191 A1* | 8/2012 | Lim | H01L 31/03923 |
| | | | 136/256 |
| 2012/0227786 A1* | 9/2012 | Hayashi | C09J 9/02 |
| | | | 136/244 |

FOREIGN PATENT DOCUMENTS

| JP | 2007-527109 A | 9/2007 |
| KR | 10-2010-0106018 A | 10/2010 |
| WO | WO2011053077 A2 * | 5/2011 |

OTHER PUBLICATIONS

KR20100106018 (A)—Lee, Oct. 1, 2010, English machine translation of the specification.*
International Search Report in International Application No. PCT/KR2012/004923, filed Jun. 21, 2012.

* cited by examiner

[Fig. 1]
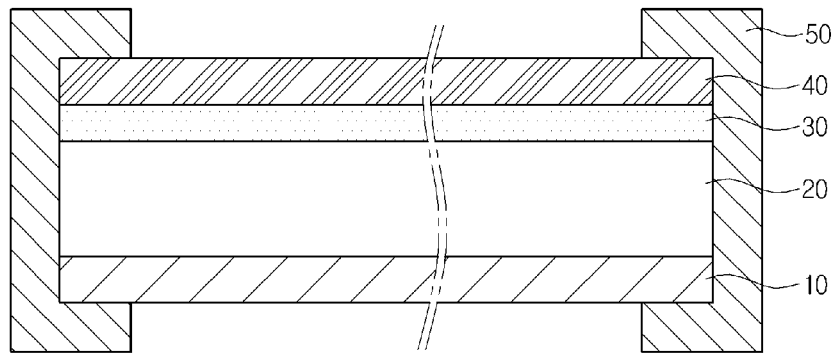
[Fig. 2]
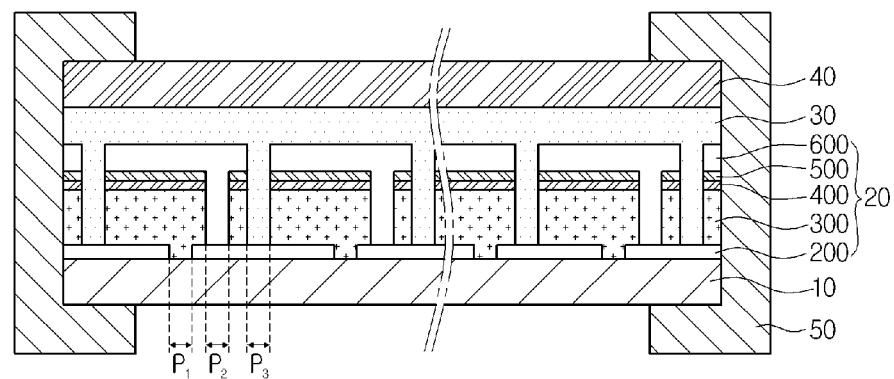
[Fig. 3]
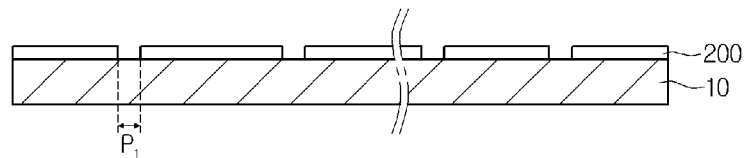
[Fig. 4]
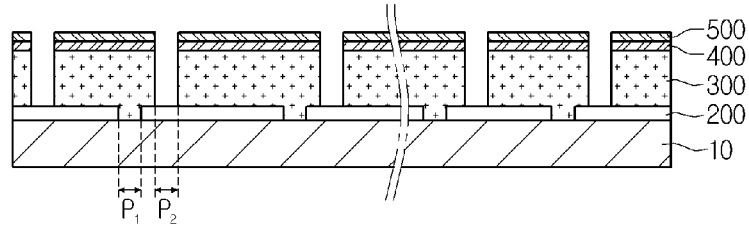
[Fig. 5]
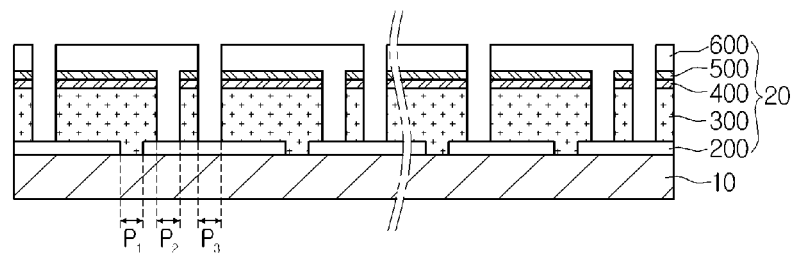

[Fig. 6]
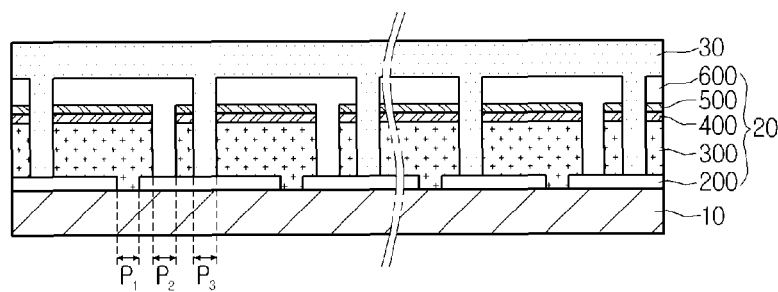
[Fig. 7]
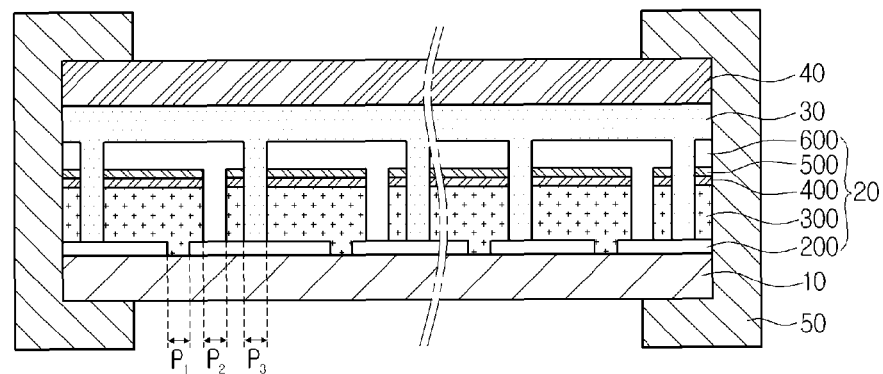

SOLAR CELL APPARATUS AND METHOD FOR FABRICATING THE SAME

CROSS-REFERENCE TO RELATED APPLICATIONS

This application is the U.S. national stage application of International Patent Application No. PCT/KR2012/004923, filed Jun. 21, 2012, which claims priority to Korean Application No. 10-2011-0106120, filed Oct. 17, 2011, the disclosures of each of which are incorporated herein by reference in their entirety.

TECHNICAL FIELD

The embodiment relates to a solar cell apparatus and a method for fabricating the same.

BACKGROUND ART

Solar cells may be defined as devices to convert light energy into electrical energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

The minimum unit of the solar cell is a cell. In general, one cell generates a very small voltage of about 0.5V to about 0.6V. Therefore, a panel-shape structure of connecting a plurality of cells to each other in series on a substrate to generate voltages in a range of several voltages to several hundreds of voltages is referred to as a module, and a structure having several modules installed in a frame is referred to as a solar cell apparatus.

Typically, the solar cell apparatus has a structure of glass/filling material (ethylene vinyl acetate, EVA)/solar cell/filling material (EVA)/surface material (back sheet). In general, the glass includes low-iron tempered glass. The glass must represent high light transmittance and be treated to reduce the surface reflection loss of incident light. The filling material is interposed between the front/rear side of the solar cell and the surface material to protect a fragile solar cell. In general, the filling material includes thermoplastic polymer or thermosetting polymer, such as EVA. The filling material can be prepared by coating polymer on the solar cell and then applying heat and pressure simultaneously. However, when the heating process is performed for the filling material, air bubbles may be generated. In addition, the initial investment cost is increased and the rework for the defective products is difficult. Further, the filling material may be discolored and the moisture-proof property of the filling material may be degraded if the filling material is exposed to ultraviolet ray for a long time.

DISCLOSURE OF INVENTION

Technical Problem

The embodiment provides a solar cell apparatus employing photo-curable polymer as a polymer adhesive layer and a method for fabricating the same.

Solution to Problem

A solace cell apparatus according to the embodiment includes a solar cell formed on a support substrate; a polymer adhesive layer including photo-curable polymer on the solar cell; and a protective panel on the polymer adhesive layer.

A method for fabricating a solar cell apparatus according to the embodiment includes the steps of preparing a solar cell on a support substrate; forming a polymer adhesive layer on the solar cell; and forming a protective panel on the polymer adhesive layer.

Advantageous Effects of Invention

According to the solar cell apparatus of the embodiment, the polymer adhesive layer is formed by using photo-curable polymer instead of conventional thermoplastic/thermosetting polymer. The polymer adhesive layer formed by using the photo-curable polymer may readily penetrate into micro patterns of the solar cell, thereby minimizing the infiltration of moisture ($H_2O$) or oxygen ($O_2$) into the solar cell. That is, the stability and reliability of the solar cell apparatus according to the embodiment can be improved.

In addition, according to the method for fabricating the solar cell apparatus of the embodiment, existence of air bubbles on the solar cell can be checked before the light is irradiated. Thus, the rework can be readily performed after checking the defect when the defect occurs. In addition, the light irradiation process can be more stably and continuously performed as compared with the thermal process, so the polymer adhesive layer can be coated on the solar cell in large quantities at the low cost.

BRIEF DESCRIPTION OF DRAWINGS

FIGS. 1 and 2 are sectional views showing a solar cell apparatus according to the embodiment; and FIGS. 3 to 7 are sectional views showing a method for fabricating a solar cell apparatus according to the embodiment.

MODE FOR THE INVENTION

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

FIGS. 1 and 2 are sectional views showing a solar cell apparatus according to the embodiment. Referring to FIGS. 1 and 2, the solar cell apparatus according to the embodiment includes a support substrate 10, a solar cell 20, a polymer adhesive layer 30, a protective panel 40, and a frame 50.

The support substrate 10 supports the solar cell 20, the polymer adhesive layer 30, and the protective panel 40.

The support substrate 10 may be a rigid panel or a flexible panel. In addition, the support substrate 10 may include an insulator. For example, the support substrate 10 may include a glass substrate, a plastic substrate, or a metallic substrate. In more detail, the support substrate 10 may include a soda lime glass substrate. In addition, the support substrate 10 may include a ceramic substrate including alumina, stainless steel, or polymer having a flexible property.

The solar cell 20 is formed on the support substrate 10. The solar cell 20 includes a plurality of cells C1, C2, C3 . . . and Cn, which are electrically connected with each other. Thus, the solar cell 20 can convert solar light into electric energy.

For instance, the cells C1, C2, C3 . . . and Cn can be connected with each other in series, but the embodiment is not limited thereto. In addition, the cells C1, C2, C3 . . . and Cn may extend in one direction in parallel to each other.

The solar cell 20 may be a CIGS solar cell including the group I-III-IV semiconductor compound, a silicon solar cell, or a dye-sensitized solar cell, but the embodiment is not limited thereto.

In detail, the solar cell 20 may include the group I-III-IV semiconductor compound. Referring to FIG. 2, the solar cell 20 includes a back electrode layer 200 formed on the support substrate 10, a light absorbing layer 300 formed on the back electrode layer 200, a buffer layer 400 formed on the light absorbing layer 300, a high-resistance buffer layer 500 formed on the buffer layer 400, and a front electrode layer 600 formed on the high-resistance buffer layer 500.

The polymer adhesive layer 30 is disposed on the solar cell 20. In detail, the polymer adhesive layer 30 is disposed between the solar cell 20 and the protective panel 40. For instance, the polymer adhesive layer 30 can directly make contact with the top surface and/or the lateral side of the solar cell 20. The polymer adhesive layer 30 may improve the adhesive strength between the solar cell 20 and the protective panel 40 and protect the solar cell 20 from external impact.

The polymer adhesive layer 30 may include photo-curable polymer. That is, the polymer adhesive layer 30 is formed by using the photo-curable polymer. In detail, the polymer adhesive layer 30 consists of the photo-curable polymer. The photo-curable polymer is cured by ultraviolet ray and transparent. Various types of photo-curable polymers generally known in the art can be used in the embodiment without specific limitations.

The photo-curable polymer may include reactive oligomer, reactive monomer and photo initiator. In addition, the photo-curable polymer may further include additives, such as a release agent, a slip agent, a plasticizer, a surfactant or a dispersing agent.

For instance, the photo-curable polymer may include about 25 wt % to about 79 wt % of the reactive oligomer, about 19.9 wt % to about 60 wt % of the reactive monomer, about 1 wt % to about 10 wt % of the photo initiator, and about 0.1 wt % to about 5 wt % of the additives, but the embodiment is not limited thereto.

The reactive oligomer may include at least one selected from the group consisting of epoxy-based resin, urethane-based resin, polyester-based resin, silicon-based resin, polyene/polythiol-based resin, spiran-based resin, epoxy resin and a combination thereof. In detail, the reactive oligomer may include epoxy acrylate, urethane acrylate, polyester acrylate, or silicon acrylate.

In addition, various types of reactive monomers generally known in the art can be used without specific limitations. Acrylate-based reactive monomer is mainly used. For instance, the reactive monomer may include at least one selected from the group consisting of entaeritriol triacrylate (PETA), dipentaeritritol pentaacrylate (DPPA), dipentaeritritol hexaacrylate (DPHA), trimethylolpropantriacrylate (TMPTA), methylacrylate, ethylacrylate, butylacrylate, 2-ethylhexylacrylate, acryl acid and methyl metaacrylate.

In addition, the photo initiator may include Benzionalkylether, Benzophenone, Benzyl dimethylkatal, Hydroxycyclohexylphenyletone, 1,1-Dichloro acetophenone, or 2-Chloro thioxanthone. In detail, the photo initiator based on α-hydroxyketone is used in order to maintain the transparency.

As described above, according to the solar cell apparatus of the embodiment, the polymer adhesive layer is formed by using the photo-curable polymer instead of the conventional thermoplastic/thermosetting polymer. The polymer adhesive layer formed by using the photo-curable polymer may readily penetrate into micro patterns, for instance, third division patterns P3 of the solar cell, thereby minimizing the infiltration of moisture ($H_2O$) or oxygen ($O_2$) into the solar cell. That is, the stability and reliability of the solar cell apparatus according to the embodiment can be improved.

The protective panel 40 is disposed on the polymer adhesive layer 30. The protective panel 40 can protect the solar cell 20 from the external physical impact and/or impurities. The protective panel 40 is transparent. For instance, the protective panel 40 includes tempered glass. The tempered glass may include low-iron tempered glass.

The frame 50 surrounds the solar cell 20. In detail, the frame 50 may surround the lateral sides of the solar cell 20. For instance, referring to FIG. 1, the same cutting surface may be formed at the lateral sides of the support substrate 10, the solar cell 20, the polymer adhesive layer 30, the protective layer 40, and the frame 50 may surround the same cutting surface.

Meanwhile, although not shown in the drawings, a sealing member (not shown) can be disposed between the frame 50 and the solar cell 20. The sealing member has the superior adhesive property and durability.

The frame and the sealing member (not shown) can prevent impurities from penetrating into the solar cell 20. In detail, the frame and the sealing member (not shown) can prevent the impurities, such as external moisture or dust, from penetrating into the lateral side of the solar cell 20.

FIGS. 3 to 7 are sectional views showing the method for fabricating the solar cell apparatus according to the embodiment.

Referring to FIGS. 3 to 6, the solar cell 20 is formed on the support substrate 10. First, the back electrode layer 200 is formed on the support substrate 10. The back electrode layer 200 is a conductive layer. The back electrode layer 200 can be formed by using one of Mo, Au, Al, Cr, W and Cu.

The back electrode layer 200 can be formed by forming the back electrode on the support substrate 10 and then forming the first pattern P1 for dividing the back electrode. The first patter P1 can be formed through the photolithography process. The back electrode layer 200 is divided by the first pattern P1. That is, the back electrode layer 200 is divided into a plurality of back electrodes by the first pattern P1.

Referring to FIG. 4, the light absorbing layer 300, the buffer layer 400 and the high-resistance buffer layer 500 are sequentially formed on the back electrode layer 200.

The light absorbing layer 300 includes a group I-III-VI compound. For example, the light absorbing layer 300 may have the CIGSS ($Cu(IN,Ga)(Se,S)_2$) crystal structure, the CISS ($Cu(IN)(Se,S)_2$) crystal structure or the CGSS ($Cu(Ga)(Se,S)_2$) crystal structure.

The light absorbing layer 300 can be formed through the sputtering process or the evaporation process. In detail, in order to form the light absorbing layer 300, a CIG metallic precursor layer is formed on the back electrode layer 200 by using Cu, In and Ga targets. The metallic precursor layer reacts with Se through the selenization process, so that the CIGS light absorbing layer 300 can be formed.

The buffer layer 400 may be formed by depositing CdS on the light absorbing layer 300 through a CBD (Chemical Bath Deposition) scheme. In addition, ZnO is deposited on the buffer layer 400 through the sputtering process, thereby forming the high-resistance buffer layer 500. After that, the second pattern P2 is formed on the light absorbing layer 300, the buffer layer 400 and the high-resistance buffer layer 500.

Referring to FIG. 5, the front electrode layer 600 is formed on the high-resistance buffer layer 500 by depositing transparent conductive materials on the high-resistance buffer layer 500. The front electrode layer 600 can be formed by forming a front electrode on the light absorbing layer 300 and then forming third patterns P3 for dividing the front electrode.

The third patterns P3 can be formed through the mechanical scheme such that the back electrode layer 200 can be partially exposed. For instance, the third patterns P3 may have a width in the range of about 80 µm to about 200 µm, but the embodiment is not limited thereto.

Referring to FIG. 6, the polymer adhesive layer 30 is formed on the solar cell 20 prepared through the above process. The polymer adhesive layer 30 can be formed through the steps of coating the photo-curable polymer on the solar cell 20; and curing the photo-curable polymer by irradiating ultraviolet ray onto the photo-curable polymer.

The photo-curable polymer may include reactive oligomer, reactive monomer and photo initiator. In addition, the photo-curable polymer may further include additives, such as a release agent, a slip agent, a plasticizer, a surfactant or a dispersing agent.

For instance, the photo-curable polymer may include about 25 wt % to about 79 wt % of the reactive oligomer, about 19.9 wt % to about 60 wt % of the reactive monomer, about 1 wt % to about 10 wt % of the photo initiator, and about 0.1 wt % to about 5 wt % of the additives, but the embodiment is not limited thereto.

The reactive oligomer may include at least one selected from the group consisting of epoxy-based resin, urethane-based resin, polyester-based resin, silicon-based resin, polyene/polythiol-based resin, spiran-based resin, epoxy resin and a combination thereof. In detail, the reactive oligomer may include epoxy acrylate, urethane acrylate, polyester acrylate, or silicon acrylate.

In addition, various types of reactive monomers generally known in the art can be used without specific limitations. Acrylate-based reactive monomer is mainly used. For instance, the reactive monomer may include at least one selected from the group consisting of entaeritriol Triacrylate (PETA), dipentaeritritol pentaacrylate (DPPA), dipentaeritritol hexaacrylate (DPHA), trimethylolpropantriacrylate (TMPTA), methylacrylate, ethylacrylate, butylacrylate, 2-ethylhexylacrylate, acryl acid and methyl metaacrylate.

In addition, the photo initiator may include Benzionalkylether, Benzophenone, Benzyl dimethylkatal, Hydroxycyclohexylphenyletone, 1,1-Dichloro acetophenone, or 2-Chloro thioxanthone. In detail, the photo initiator based on α-hydroxyketone is used in order to maintain the transparency.

The photo-curable polymer having the above composition is coated on the solar cell 20. For instance, the photo-curable polymer can be coated on the solar cell 20 through the spin coating scheme, the screen printing scheme, the bar coating scheme, the inkjet scheme or the dipping scheme, but the embodiment is not limited thereto.

According to the method for fabricating the solar cell apparatus of the embodiment, existence of air bubbles on the solar cell 20 can be checked after coating the photo-curable polymer on the solar cell 20. Thus, if the air bubbles are generated on the solar cell 20, the coating process is performed once more, thereby reducing the defect rate cased by the air bubbles.

Then, the light is irradiated onto the photo-curable polymer. At this time, the light has the short wavelength. In detail, the ultraviolet ray is irradiated onto the photo-curable polymer. For instance, the light has the wavelength in the range of about 150 nm to about 400 nm, but the embodiment is not limited thereto. According to the method for fabricating the solar cell apparatus of one embodiment, the light having the quantity of about 1,000 mJ/cm2 to about 9,000 mJ/cm2 is uniformly irradiated onto the photo-curable polymer for about 1 minute to about 60 minutes by using a UV curing device to cure the photo-curable polymer.

As described above, the polymer adhesive layer 30 formed by using the photo-curable polymer may more readily penetrate into the micro patterns of the solar cell as compared with the conventional polymer adhesive layer formed by using the thermoplastic/thermosetting resin. Referring to FIG. 6, the photo-curable polymer according to the embodiment may readily penetrate into the micro patterns, such as the third patterns P3 of the solar cell 20, thereby minimizing the infiltration of moisture ($H_2O$) or oxygen ($O_2$) into the solar cell. That is, the stability and reliability of the solar cell apparatus according to the embodiment can be improved. In addition, the light irradiation process can be more stably and continuously performed as compared with the thermal process, so the polymer adhesive layer can be coated on the solar cell in large quantities at the low cost.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
   a solar cell including a back electrode layer, a light absorbing layer, a buffer layer, a high-resistance buffer layer, and a front electrode layer sequentially disposed on a support substrate;
   a polymer adhesive layer including photo-curable polymer on the solar cell;
   a protective panel on the polymer adhesive layer; and
   a frame surrounding the support substrate, the solar cell, the polymer adhesive layer, and the protective panel;

wherein the back electrode layer is in direct physical contact with the light absorbing layer, wherein the solar cell comprises:

a plurality of first patterns dividing the back electrode layer;

a plurality of second patterns dividing the light absorbing layer, the buffer layer, and the high-resistance buffer layer; and a plurality of third patterns dividing the light absorbing layer, the buffer layer, high-resistance buffer layer, and the front electrode layer;

wherein the support substrate includes a soda lime glass;

wherein the protective panel includes a low-iron tempered glass;

wherein the solar cell is in direct physical contact with the support substrate;

wherein the polymer adhesive layer is disposed between the solar cell and the protective panel;

wherein the polymer adhesive layer fills the plurality of third patterns;

wherein the polymer adhesive layer is in direct physical contact only with a top surface of the front electrode layer, a bottom surface of the protective panel, a top surface of the back electrode layer in the third pattern, a portion of an inside surface of the frame, and lateral surfaces of the light absorbing layer, the buffer layer, the high-resistance butter layer, and the front electrode layer in the plurality of third patterns;

wherein the frame is in direct physical contact with a top surface of the protective panel, a bottom surface of the support substrate, a lateral surface of the support substrate, the back electrode layer of an outermost portion of the solar cell, the light absorbing layer of the outermost portion of the solar cell, the buffer layer of the outermost portion of the solar cell, the high-resistance buffer layer of the outermost portion of the solar cell, the front electrode layer of the outermost portion of the solar cell, the polymer adhesive layer, and the protective panel;

wherein the photo-curable polymer includes an additive; and wherein the additive comprises a release agent, a slip agent, a plasticizer, a surfactant, or a dispersing agent.

2. The solar cell apparatus of claim 1, wherein the photo-curable polymer further includes a reactive oligomer, a reactive monomer and a photo initiator.

3. The solar cell apparatus of claim 2, wherein the reactive oligomer includes one selected from the group consisting of epoxy-based resin, urethane-based resin, polyester-based resin, silicon-based resin, polyene/polythiol-based resin, spiran-based resin, epoxy resin and a combination thereof.

4. The solar cell apparatus of claim 2, wherein the reactive oligomer includes epoxy acrylate, urethane acrylate, polyester acrylate, or silicon acrylate.

5. The solar cell apparatus of claim 2, wherein the reactive monomer includes at least one selected from the group consisting of pentaerythritol triacrylate (PETA), dipentaerythritol pentaacrylate (DPPA), dipentaerythritol hexaacrylate (DPHA), trimethylolpropantriacrylate (TMPTA), methylacrylate, ethylacrylate, butylacrylate, 2-ethylhexylacrylate, acryl acid, and methyl methacrylate.

6. The solar cell apparatus of claim 2, wherein the photo-curable polymer includes about 25 wt % to about 79 wt % of the reactive oligomer, about 19.9 wt % to about 60 wt % of the reactive monomer, about 1 wt % to about 10 wt % of the photo initiator, and about 0.1 wt % to about 5 wt % of the additives.

7. The solar cell apparatus of claim 2, wherein the photo initiator includes Benzionalkylether, Benzophenone, Benzyl dimethylkatal, Hydroxycyclohexylphenylketone, 1,1-Dichloro acetophenone, or 2-Chloro thioxanthone.

* * * * *